United States Patent [19]

Salvagno et al.

[11] Patent Number: 4,618,820

[45] Date of Patent: Oct. 21, 1986

[54] PROBE SUPPORT FOR TEST FIXTURE OF PRINTED CIRCUIT ARTWORKS

[75] Inventors: Elvio Salvagno; PierLuigi Piacentino, both of Caluso, Italy

[73] Assignee: Honeywell Information Systems Italia, Milan, Italy

[21] Appl. No.: 621,274

[22] Filed: Jun. 15, 1984

[30] Foreign Application Priority Data

Jul. 4, 1983 [IT] Italy .................... 21915 A/83

[51] Int. Cl.⁴ .............. G01R 1/04; G01R 31/02; G01R 31/28
[52] U.S. Cl. ................... 324/158 F; 324/73 PC; 324/158 P
[58] Field of Search ............. 324/158 F, 73 PC, 72.5, 324/158 P

[56] References Cited
U.S. PATENT DOCUMENTS

| 4,099,120 | 7/1978 | Aksu | 324/158 P |
| 4,132,948 | 1/1979 | Katz | 324/158 F X |
| 4,230,985 | 10/1980 | Matrone et al. | 324/73 P C X |
| 4,352,061 | 9/1982 | Matrone | 324/158 P X |
| 4,460,868 | 7/1984 | Schmitt et al. | 324/158 P |

Primary Examiner—Ernest F. Karlsen
Assistant Examiner—Vinh P. Nguyen
Attorney, Agent, or Firm—Nicholas Prasinos; John S. Solakian

[57] ABSTRACT

A probe support for a test fixture of printed circuit artworks comprising a base plate defining a supporting plane for connecting pins of a plurality of probes, a corresponding plurality of connecting elements, a cover plate designed to protect the contact tips of the probes and of connecting elements when the probe support is not to be used, etc. The base plate and the cover plate may be alternatively removed for set up and use respectively; the probes and the connecting elements being restrained to and protected by either the cover plate or the base plate. In this way both assembly of the probe support and the wiring harness between the probe pins and the pins of the connecting elements is made easier. The probe support further comprises a plate provided with a plurality of holes which house and axially guide the contact tips of the probes during active test.

1 Claim, 3 Drawing Figures

FIG. I

PROBE SUPPORT FOR TEST FIXTURE OF PRINTED CIRCUIT ARTWORKS

BACKGROUND

1. Field of the Invention

The present invention relates to a probe support for test fixture of printed circuit artworks (PWA).

2. Description of Prior Art

As known, the PWA test fixtures enable the electrical connection of a plurality of nodes of a circuit implemented on a circuit board to an automatic test system. Such fixtures generally comprise:

- a holding station for the PWA to be tested;
- an element provided with a suitably arranged plurality of probes which are forced to contact prearranged soldering spots of the printed circuit board;
- a connector whose pins are electrically connected to the probes with the well known "wire wrapping" technique;
- mechanical or pneumatic actuation means forcing the electrical contact between probes and soldering spots of the printed circuit board.

It is clear that specific probe support elements are to be provided and suitable electrical connections between probes and connector pins are to be arranged for each different PWA to be tested. In the prior art, to avoid the need for several probe supports, universal probe supports, that are provided with a probe matrix, have been suggested; such probes being selectively actuated according to the configuration of the board to be tested. This type of solution is, for instance, disclosed in U.S. Pat. No. 4,352,061. However the manufacturers of PWA's still prefer, for mass production suitably arranged probe supports, in view of the high cost of the universal tips and the maintenance costs necessitated by the unavoidable probe deterioration which reduces the reliability of the electrical contact between the probes and the soldering spots, after a certain number of test operations. The embodiment of specific probe supports is implemented by using insulating material boards supporting the probes and having a distribution of the holes identical to the ones corresponding to the soldering spots of the PWA to be tested. Such probe-supporting insulated boards are obtained by means of working bases identical to the ones used for manufacturing the printed circuit boards, and utilized in the assembly of the PWA's to be tested as disclosed in U.S. Pat. No. 4,132,948. In setting up a fixture for testing PWA's a great amount of work and time is spent for the wiring harness between the probe pins and the corresponding pins of the connector. In order to facilitate and speed up the wiring harness operations, U.S. Pat. No. 4,099,120 suggests arranging the connectors on the probe support so that the pins of the connector and the ones of the probes used for the wiring harness are on the same plane. According to this patent, the probe support comprises a unitary element independent of the remaining parts of the test fixture, and accordingly wiring harness operations can be easily automated. However such a probe support results in handling difficulties and requires careful handling during the wiring harness operation. In fact, the probe tips are not suitably protected and kept in a fixed rest position when the probe support is not mounted on the test fixture. A further disadvantage, occurring in the probe support disclosed in U.S. Pat. No. 4,132,948 and in test fixtures known in the art, is that there may not be the desired electrical contact between some of the contact tips of the probes and the corresponding soldering spots of the printed circuit board, during the testing phase. In fact, when the probes are forced against the board to be tested, the contact tips of some of such probes deviate from their axis owing to bulging of the soldering spots, so the electrical contact with the pre-established node of the circuit to be implemented on the printed circuit board is not assured. In the worst case condition the deviated contact tip of the probe may cause a short circuit between the point to be tested and the contiguous one.

Such disadvantages are overcome by the prsent invention.

OBJECTS OF THE INVENTION

A primary object of the invention is to provide an improved probe support for a test fixture for PWA boards.

SUMMARY AND FEATURES OF THE INVENTION

According to a first feature of the invention the probe support consists of a unitary element which can be easily removed from the test fixture without causing any handling problem. In fact, the probe support of the present invention comprises one or more insulating plates (in preference to fiberglass), bearing transverse probes arranged according to a predetermined configuration, of a further insulating plate parallel and contiguous to the previous ones and including a connector. The probes and the connector have, on one side, pins for the wiring harnesses and on the other side contact tips which, in the case of the probes, are spring biased. A first insulating plate, labeled the base, having a suitable thickness and parallel to the bearing plates, defines a support plane for the wiring harness pins of the probes and the connectors. A second plate, labeled the cover, having a suitable thickness and parallel to the bearing plates, protects the probe tips. When the probe bearing element is inserted into the test fixture, the cover is removed and the board to be tested is positioned parallel to the bearing plates of the probe support with the soldered side turned towards the contact tips of the probes. When, on the other hand, wiring harness operations are to be performed, between the pins of the probes and the connector, the base is removed and both the connector and the contact tips of the probes are protected and kept in position by the cover. Finally, when the bearing probe element is not used, it can be stacked with no problems and in any way, providing that both base and cover are in place.

According to a further feature of the invention, the probe support is provided with an additional insulating plate for guiding the contact tips of the probes. Such a guiding plate, parallel to the support plates of the probes, is provided with a predetermined plurality of holes acting as housing for the several contact tips of the probes. It is kept in position by spring contact with the mounted cover. During the test, the board to be tested lays on the guiding plate thus avoiding possible deviations of the contact tips from their axis.

BRIEF DESCRIPTION OF THE DRAWINGS

These and other features of the invention will become more clear from the following description of a preferred embodiment of the invention and from the enclosed drawings where.

BRIEF DESCRIPTION OF THE PREFERRED EMBODIMENT

Figure 1:
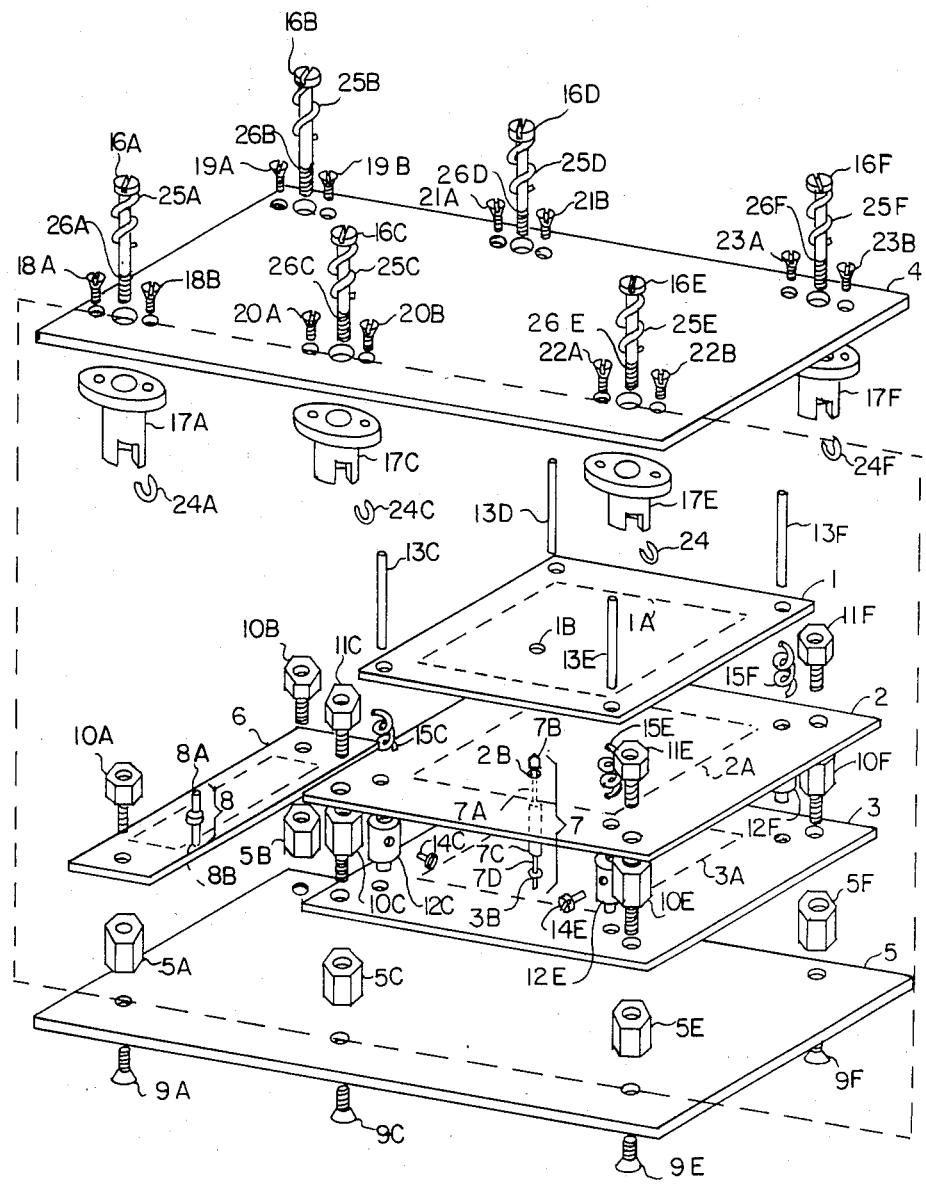
FIG. 1 shows an exploded perspective view of the probe support for the present invention.

Referring to FIG. 1, there is shown an exploded perspective of the probe support. It comprises a plurality of insulating plates 1, 2, 3, 4, 5, 6 (e.g., in fiberglass of the kind marketed with code G10) of suitable type and arranged in parallel to each other. Plates 1, 2, 3 have within a certain area (respectively 1A, 2A, 3A outlined in FIG. 1) a plurality of holes corresponding to each other axially (such as 1B, 2B, 3B respectively); the layout of such holes within the area 1A, 2A, 3A is identical to the layout of holes presented on the printed circuit board on which the circuit to be tested is assembled. The drilling of the plates is made with the same tools and the same processes used to drill the printed circuits that support the electrical components. In this way, even if the diameter of the holes, such as 1B, 2B, 3B is greater than one of the holes in the printed circuit boards to be tested, the drilling accuracy typical of the printed circuit boards is maintained. Plates 1, 3 support a plurality of probes, such as probe 7 of FIG. 1. The probes are of a conventional type and are comprised of a spring biased plunger 7A housed in a hollow cyclinder 7C provided with a sharpened tip 7B at its end. The lower end of the hollow cylinder supports a connection pin 7D. During the set up of the probe support, the hollow cylinder 7C of probe 7 is forced into holes 2B, 3B of plates 2, 3 respectively. The spring biased plunger 7A is then inserted into hollow cylinder 7C and is kept in position by friction. A plate 6 is provided within an area 6A with a plurality of holes housing the connecting elements, such as element 8. Once the connecting elements, such as 8, are mounted on plate 6 they provide connection for a fixed contact tip, such as 8A, and a connection pin, 8B. Six threaded spacers are attached to one side of plate 5 (only 5 spacing means are shown in FIG. 1; that is 5A, 5B, 5C, 5E, 5F respectively) by means of corresponding tapered head screws (in FIG. 1 screws 9A, 9C, 9E, 9F as shown) which insert into suitable tapered holes of base plate 5. Plate 6 lays on spacers 5A, 5B; while platen 3 lays on the remaining spacers. Plates 3 and 6 are attached to their corresponding spacers on which they lie by means of spacing turrets (turrets 10A, 10B, 10C, 10E, 10F are shown in Figure 1). Such turrets are provided with a cylindrical and threaded lower part which screws into a threaded housing of the corresponding spacers. through suitable holes present on plates 3, 6. The upper part of turrets 10C-10F performs the same function of spacers 5A-5F. In fact, plate 2 lays on turrets 10-10F and is attached to plate 3 by means of additional turrets identical, as to the structure, to the previously described turrets (additional turrets 11C, 11E, 11F are shown in FIG. 1). Some cylindrical elements are also inserted between plates 2 and 3 (cylindrical elements 12C, 12E, 12F are shown in FIG. 1), such elements being provided with protruding lower pins for insertion into suitable holes of platen 3. These cylindrical elements, besides acting as additional spacers, are further designed to receive in an axial housing a corresponding register pegs 13C–13F, which fit through suitable holes in plates 1, 2. Such holes axially correspond to the holes in plate 3 where the lower pins of elements 12C–12F are inserted. Pegs 13C–13F are attached to the corresponding elements 12C–12F by means of clamping screws screwing into a threaded housing of such cylindrical elements (only screws 14C, 14E are shown in FIG. 1). The holes, such as 1B, of plate 1 act as housing for probe tips, such as 7B. Plate 1 is biased by a spring, each one being inserted on a corresponding peg (spring 15C, 15E, 15F are shown in FIG. 1). Plate 4, the cover, is attached to the probe support by means of 6 cylindrical headed screws 16A, 16B, 16C–16F which screw into corresponding threaded housing turrets 10A, 10C, 11C–11F respectively, through holes in plate 4 and suitable cylindrical spacers 17A, 17C, 17E, 17F in FIG. 1). Cylindrical spacers 17A–17F . are attached to plate 4 by means of pairs of tapered headed screws 18A, 18B–23A, 23B respectively. Such screws are screwed into threaded holes in the shoulder of the corresponding cylindrical spacer through suitable tapered holes in plate 4. When screws 16A–16F are housed in the corresponding cylindrical spacers they are biased by springs 25A–25F respectively. Such screws and the corresponding springs are attached to spacers 17A–17F by means of retaining rings (for instance of Benzing type) 24A–24F, which are inserted in undercuts 26A–26F through openings in the spacers. In this way, when the cover is removed, the loosening of screws 16A–16F and of the corresponding springs 25A–25F is avoided.

Figure 2:
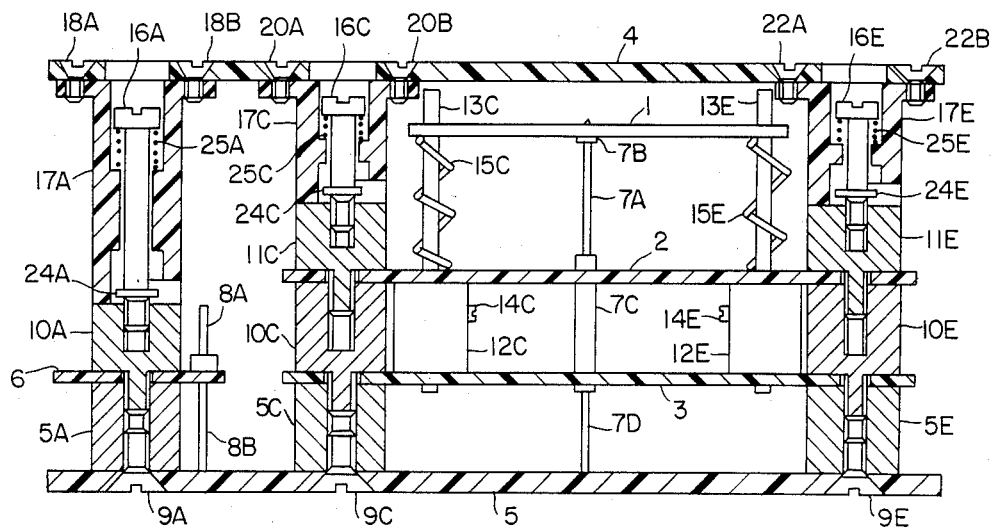
FIG. 2 shows a cross section of plane A—A of FIG. 1 of the probe support when it is assembled.

Referring now to FIG. 2, there is shown in section view of plane A—A of FIG. 1, the probe support of the present invention when the assembly is complete. The details of FIG. 2 are easily ascertained from the description already made in connection with FIG. 1. With reference to FIGS. 1 and 2, the operations for setting up the probe support of the invention are as follows:

(a) mounting contacts 8 on plate 6 and flow-soldering them on the side where the connection pins 8B, etc. are present;

(b) attaching threaded spacers 5A–5F to base 5 by means of screws 9A–9F;

(c) attaching plate 6 and plate 3 to threaded spacers 5A–5F through turrets 10A–10F;

(d) inserting cylindrical elements 12C–12F into plate 3;

(e) inserting pegs 13C–13F into cylindrical elements 12C–12F and clamping them to these by means of the corresponding screws 14C–14E;

(f) attaching plate 2 to turrets 10C–10F via additional turrets 11C–11F;

(g) inserting the hollow cylinders and the probes 7 into plates 2, 3;

(h) inserting springs 15C–15F onto the corresponding pegs 13C–13F;

(i) inserting guiding plate 1;

(j) assembling cylindrical spacers 7A–7F and corresponding springs via retaining rings 24A–24F;

(k) fixing assembled cylindrical spacers by means of tapered head screws 18A, 18B–23A, 23B, to the cover;

(l) attaching the cover to turrets 10A, 10B, 11C–11F by means of screws 16A, 16B, 16C–16F;

(m) removing the base by unscrewing screws 9A–9F;

(n) performing wiring harness operations among the connecting pins, such as 8B, and the probe pins, such as 7D;

(o) attaching base 5 to threaded spacers 5A–5B again;

(p) removing cover 4 by unscrewing screws 16A–16F and inserting the probe support in suitable position within the test fixture.

Figure 3:
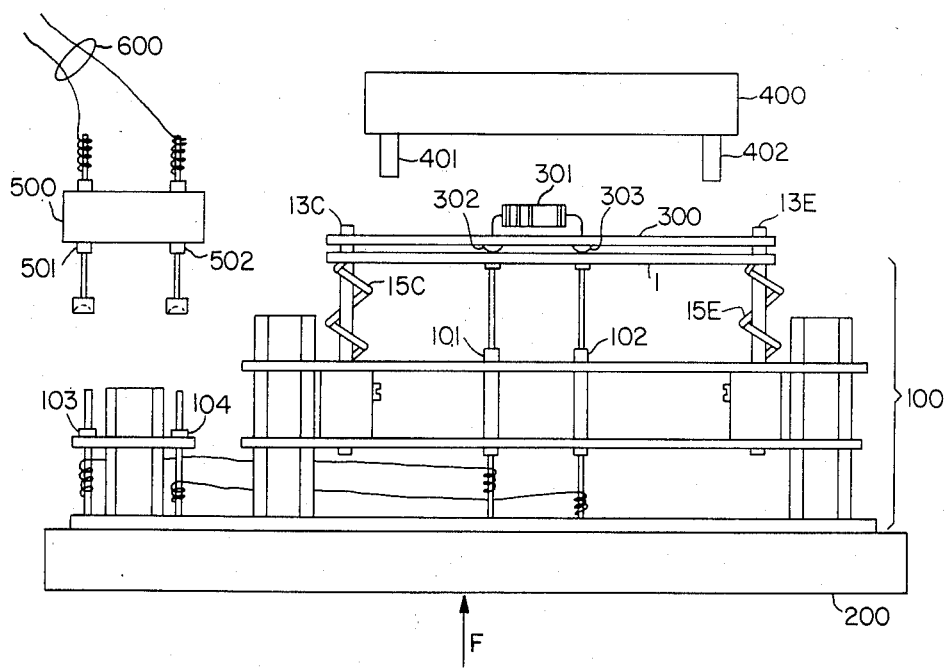
FIG. 3 shows, in simplified front view, a test fixture for printed circuit boards using the probe support of the present invention.

Referring now to FIG. 3, there is shown in schematic view, a test fixture provided with the probe support of the present invention. The probe support, without cover 4 and referenced via reference number 100, in FIG. 3, is suitably position on a slide 200. Printed circuit artwork 300, which has to be tested and has a hole arrangement identical to guide plate 1, is laid on plate 1 and kept in position by pegs 13C, 13E. Plate 300 bears on one side of a plurality of electrical components and has a plurality of soldering spots on the opposite side. For example, FIG. 3 shows plate 300 bearing a component 301 and having two soldering spots 302, 303. The contact tips of two probes 101, 102 are directed against soldering spots 302, 303. Such contact tips are housed in corresponding holes of guiding plate 1. The connecting pins of probes 101, 102 are electrically connected by leads to the pins of two connecting elements 103, 104 respectively. Over probe support 100 two fixed elements 400 and 500 are present. Element 400 is provided with a plurality of positioning fingers 401, 402 protruding towards zones of plate 300, free of electronic components. Element 500 is provided with a plurality of spring contacts, one for each connecting element mounted on plate 6. Spring contact 501, 502 corresponding to connecting elements 103, 104 respectively, are shown in FIG. 3. Likewise the probes, contacts such as 501, 502, comprise a spring biased plunger housed in a hollow cylinder. The plunger has, at its free end, a suitable housing designed to receive the contact tip of the corresponding connecting element mounted on plate 6 and to establish with such plate an electrical continuity. Likewise the probes, the hollow cylinders of contact 501, 502 have connection pins. A set of leads 600 enables the connection of the test fixture to the automatic test system. During an active test phase a force, in the direction of arrow F of FIG. 3, is applied to slide 200 and pushes the probe support 100 against elements 400 and 500. Spring contacts, such as 501, 502, contact the corresponding connecting elements 103, 104 while fingers 401, 402 press PWA 300 and plate 1 which tend to move lower, thus compressing springs 15C, 15E. Tips 101, 102 are therefore forced to contact soldering spots 302, 303 respectively; the contact tip of such probes being kept in axial position by guide plate 1.

It is clear that several modifications can be made to the described support for test fixture without departing from the scope of the invention.

What is claimed is:

1. A probe support for a test fixture for testing printed circuit artwork boards (PWA's) comprising:
    a plurality of probes, each one provided with a contact tip biased by a spring and with a connection pin;
    a plurality of connecting elements, each one provided with a contact tip and a connection pin electrically connected to the connection pin of a corresponding probe;
    a first supporting plate for supporting said plurality of probes;
    a second supporting plate for supporting said plurality of connecting elements;
    a base plate parallel to said first and second supporting plates and facing the ends of the pins of said plurality of probes and said plurality of connecting elements;
    first means for spacing said base plate from said first and second supporting plates;
    second means removably attaching said base plate to said first and second support plates in the spaced relation imposed by said first means;
    a cover plate parallel to said first and second supporting plates and facing the contact tips of said plurality of probes and said plurality of connecting elements;
    third means for spacing said cover plate from said first and second supporting plates; and
    fourth means removably attaching said cover plate to said first and second support plates in the spaced relation imposed by said third means;
    whereby said cover plate provides protection of said contact tips and unitary assembling of said first and second supporting plates when said base plate is removed from said first and second supporting plates to perform wiring operations on the harness between the pins of said probes and the pins of said connecting elements, and whereby said base plate provides protection of said pins and unitary assembly of said first and second supporting plates when said cover plate is removed for use of said probe support in a test fixture.

* * * * *